United States Patent [19]
Daoud

[11] Patent Number: 6,089,392
[45] Date of Patent: Jul. 18, 2000

[54] DOOR RETENTION DEVICE MECHANISM FOR A BUILDING ENTRANCE PROTECTOR

[75] Inventor: Bassel Hage Daoud, Parsippany, N.J.

[73] Assignee: Lucent Technologies, Inc., Murray Hill, N.J.

[21] Appl. No.: 09/039,852

[22] Filed: Mar. 16, 1998

[51] Int. Cl.[7] .................................................... B65D 6/00
[52] U.S. Cl. ........................ 220/4.02; 220/335; 220/3.8
[58] Field of Search .................................. 220/4.02, 335, 220/334, 338, 3.8

[56] References Cited

U.S. PATENT DOCUMENTS

| | | | |
|---|---|---|---|
| 4,349,120 | 9/1982 | DiNardo | 220/831 X |
| 4,574,944 | 3/1986 | Gregory | 220/831 X |
| 4,967,924 | 11/1990 | Murofushi et al. | 220/831 X |
| 5,574,042 | 11/1996 | Oku et al. | |
| 5,750,699 | 5/1998 | Oku et al. | |
| 5,803,292 | 9/1998 | Daoud | 220/4.02 |

*Primary Examiner*—Steven Pollard

[57] ABSTRACT

A building entrance protector having a housing unit. The housing unit is provided with a plurality of walls and a sidewall, the sidewall defining an outer side and an inner side. A door is coupled to the sidewall and rotatable about an axis of rotation with the door defining a frictionally engaging edge. The door is positionable between a closed position and a secured opened position. A frictionally engaging member is mounted on the outer side of the sidewall so that when the door is moved from the closed position to the secured opened position, the frictionally engaging edge interferes with the engaging member to restrain the door. Additionally, the distance from the axis of rotation to the frictionally engaging edge of the door is less than the distance from the axis of rotation to a frictionally engaging portion of the frictionally engaging member.

10 Claims, 5 Drawing Sheets

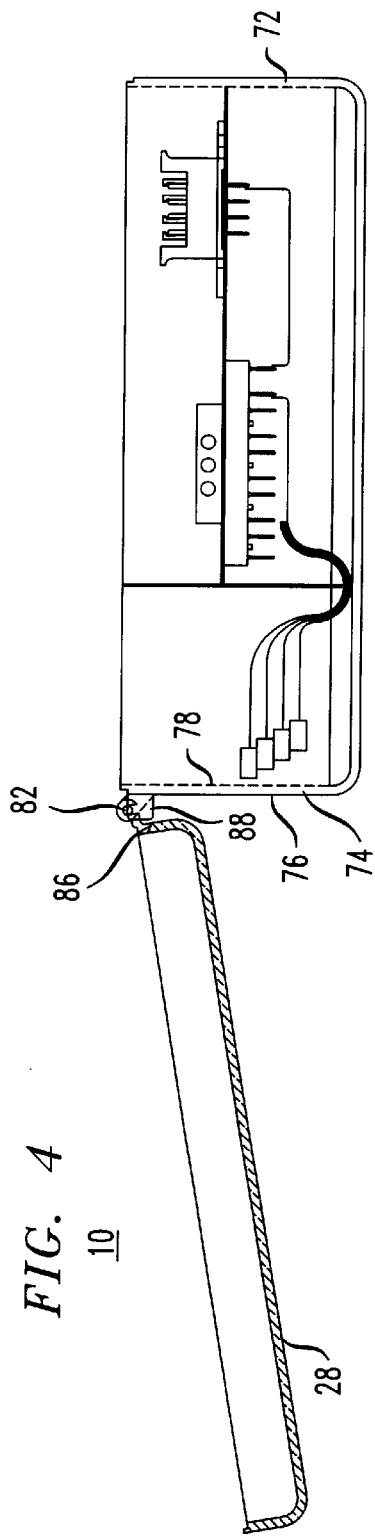
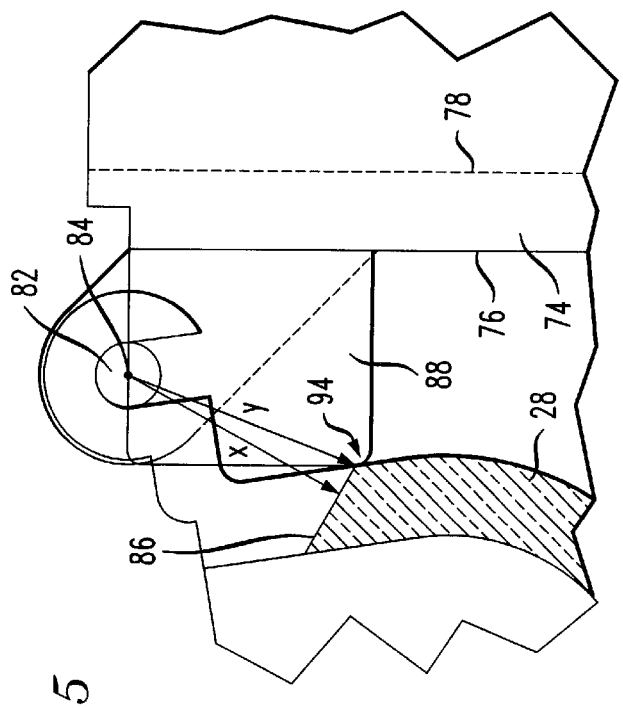
FIG. 4
FIG. 5

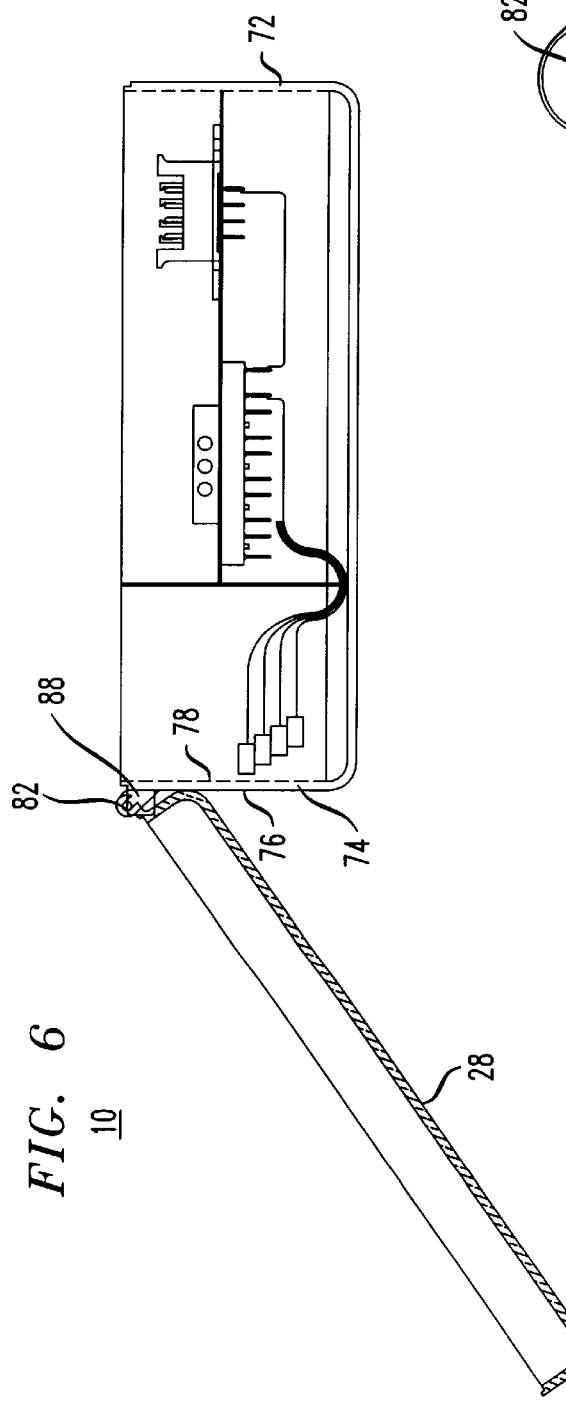
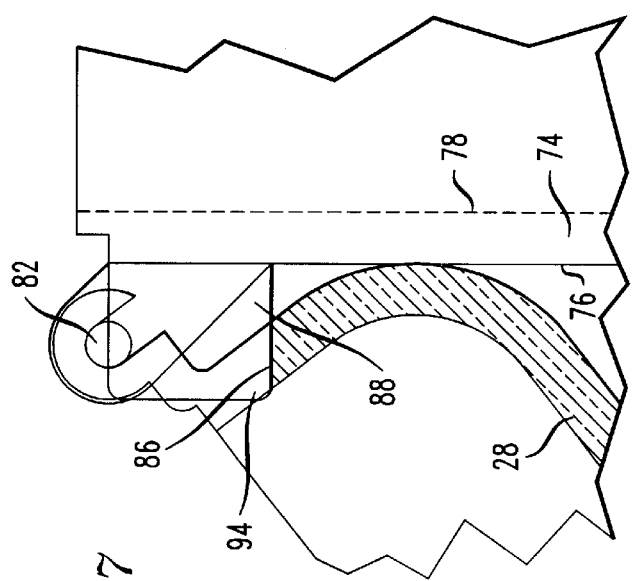

DOOR RETENTION DEVICE MECHANISM FOR A BUILDING ENTRANCE PROTECTOR

FIELD OF THE INVENTION

This invention relates to a building entrance protector, and more particularly, to a building entrance terminal which includes a retention mechanism for preventing a housing door of the building entrance protector from closing unintentionally.

BACKGROUND OF THE INVENTION

Building entrance protectors are used to provide telephone lines from the telephone company's street cables to multiple tenants of residential or commercial buildings. Typically telephone wire line pairs extend into a splice unit disposed within the housing of the building entrance protector. Telephone wire lines are then provided to a line protector unit that functions to suppress transient electrical signals resulting from thunderstorms and other environmental noises. Telephone wires are then extended to various tenant locations within the building via an internal connection unit.

In the telecommunications industry, in order to provide service to a customer, or a plurality of customers at a location, the building entrance protector is generally installed either inside or outside of the building. This allows for telephone wiring to be carried into the building. The building entrance protector is generally comprised of a housing unit enclosed by a door which is hinged to a side wall of the housing unit. When opened, the door moves freely on its hinges.

In many instances it may become necessary to restrain the door of the building entrance protector as the door oftentimes swings closed due to wind or other force. Moreover, when the building entrance protector is being serviced by a technician, the accidental closing of the door can swing and cause injury to the technician. Thus, there is the need for an arrangement to provide for the secure retention of the door of the building entrance protector when the door is in an opened position.

SUMMARY OF THE INVENTION

In accordance with one embodiment of the invention, a building entrance terminal or the like comprises a housing unit having a plurality of walls and a sidewall, with the sidewall defining an outer side, and an inner side. The door is coupled to the sidewall and rotatable about an axis of rotation. The door defines a frictionally engaging edge with the door positionable between a closed position and a secured opened position. A frictionally engaging member is mounted on the outer side of the sidewall of the housing unit so that when the door is moved from the closed position to the secured opened position, the frictionally engaging edge frictionally interferes with the engaging member to restrict the door from snapping shut.

In a preferred embodiment of the invention, the distance from the axis of rotation to the frictionally engaging edge of the door is less than the distance from the axis of rotation to a frictionally engaging portion of the frictionally engaging member.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects and advantages thereof may best be understood by reference to the following detailed description when read with the accompanying drawings in which:

FIG. 4 illustrates a cross-sectional side view of the frictionally engaging edge of the building entrance protector of FIG. 1 interfering with the frictionally engaging member;

FIG. 5 illustrates a close-up cross-sectional side view of the frictionally engaging edge of the building entrance protector of FIG. 1 interfering with the frictionally engaging member;

FIG. 6 illustrates a cross-sectional side view of the frictionally engaging edge of the building entrance protector of FIG. 1, the frictionally engaging edge having engaged the frictionally engaging member; and FIG. 7 illustrates a close-up cross-sectional side view of the frictionally engaging edge of the building entrance protector of FIG. 1, the frictionally engaging edge having engaged the frictionally engaging member.

DETAILED DESCRIPTION OF THE PRESENTLY PREFERRED EMBODIMENT

Figure 1:
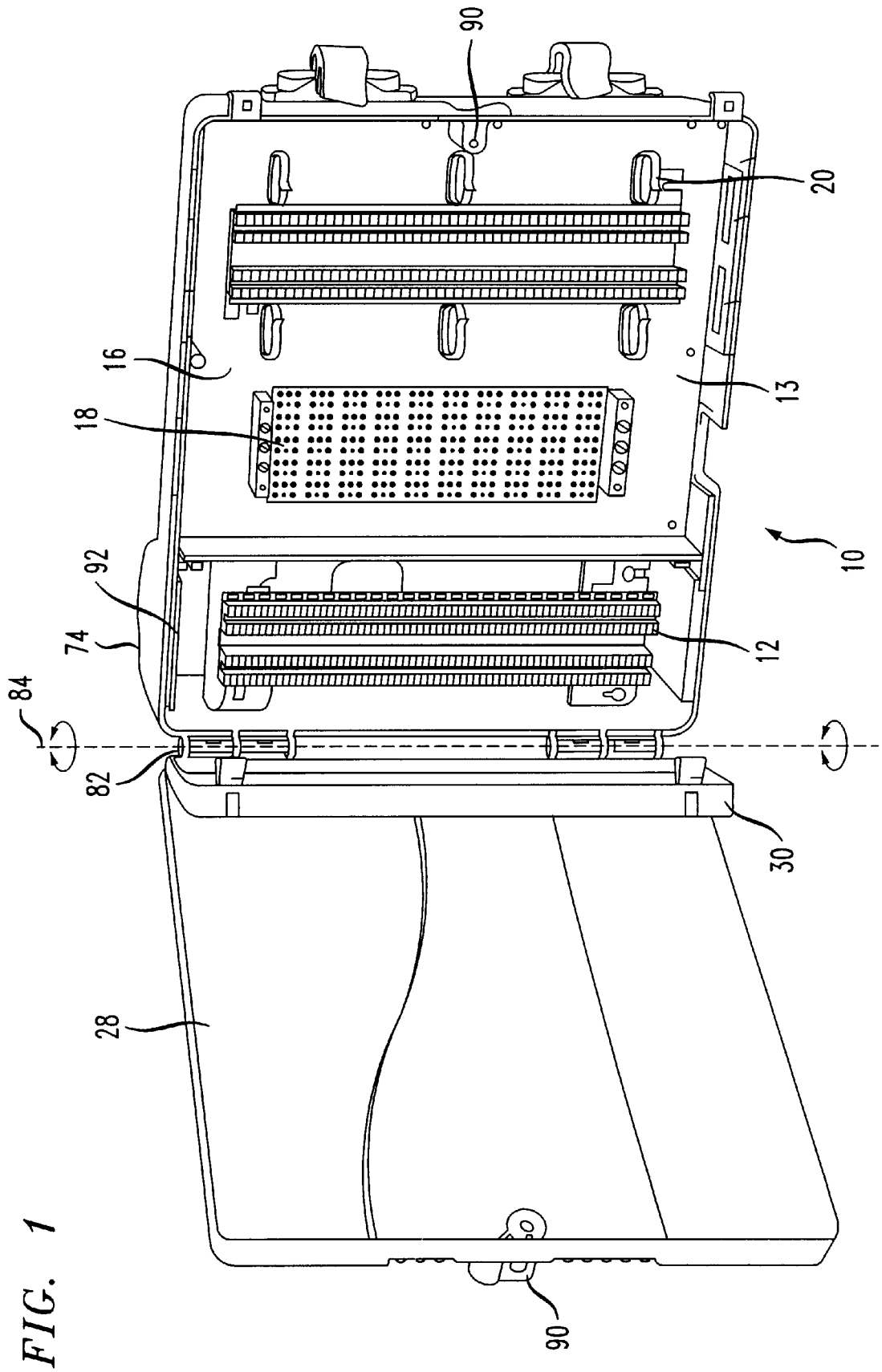
FIG. 1 illustrates a front view of a building entrance protector terminal in accordance with one embodiment of the invention.

FIG. 1 illustrates a building entrance protector terminal 10 for use with cable or telephone wiring, in accordance with one embodiment of the invention. The invention, however, is not limited in scope in this respect. For example, other types of wiring enclosures or other enclosures may include the inventive features disclosed herein.

Figure 2:
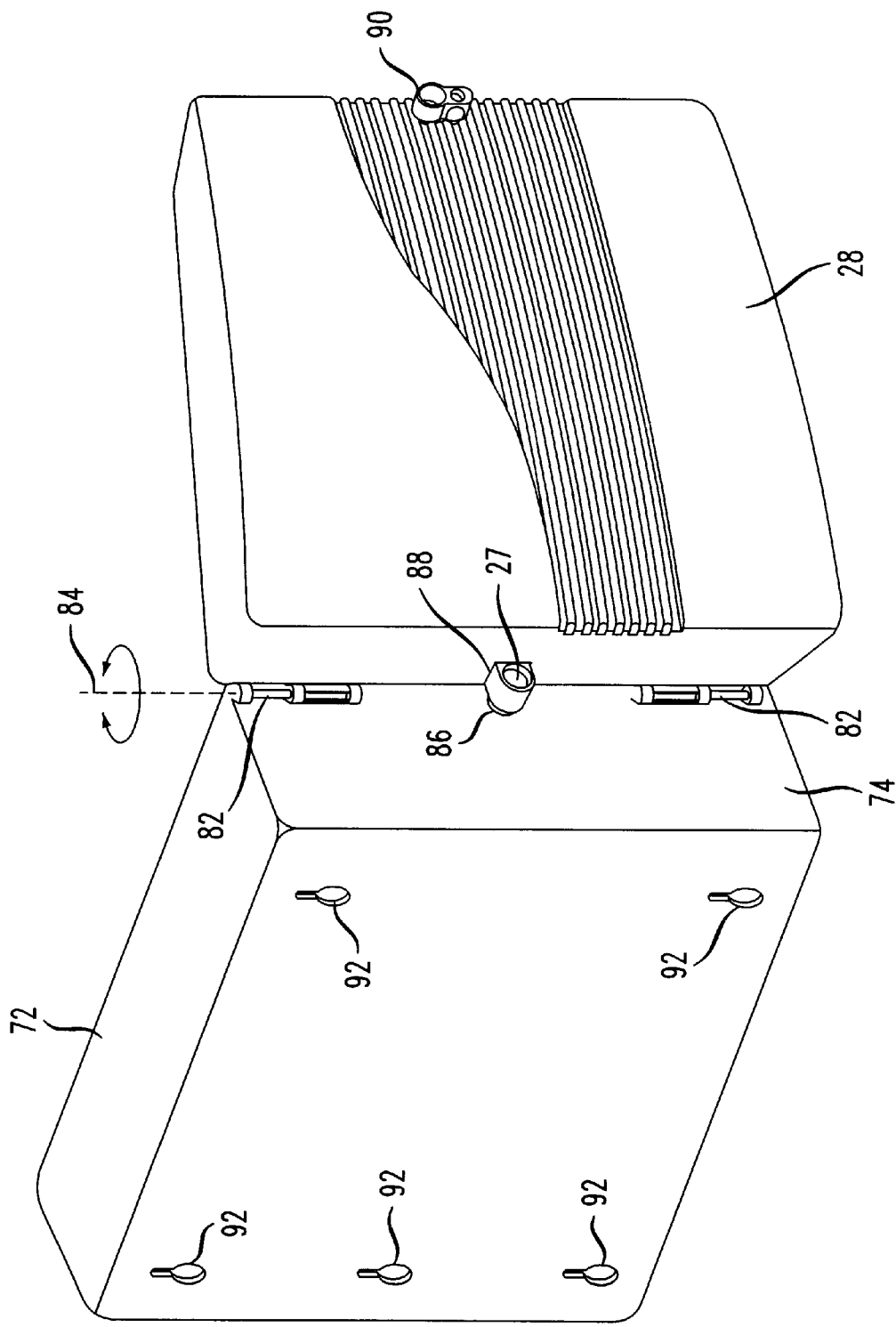
FIG. 2 illustrates a back view of the building entrance protector terminal shown in FIG. 1.

With reference to FIGS. 1 and 2, building entrance protector 10 is shown to comprise a housing unit 72 having a plurality of walls and a sidewall 74. As best seen in FIGS. 3–7, sidewall 74 is shown to define an outer side 76 and an inner side 78. Building entrance protector 10 further comprises a door 28 which is hinged to sidewall 74 with a hinge 82. Door 28 is therefore rotatable about an axis of rotation 84 for closing and opening building entrance protector 10. Door 28 is shown to define a frictionally engaging edge 86 best seen in FIG. 2. In a preferred embodiment, frictionally engaging edge 86 forms a notch 27 in door 28. A frictionally engaging member 88 is mounted on outer side 76 of sidewall 74 also best seen in FIG. 2.

Building entrance protector 10 also includes a door 30 which is hinged together with door 28 to sidewall 74 with hinge 82. This creates a separately closeable compartment called a splice chamber 12. Housing unit 72 is further divided into a second chamber 13 which contains a protection panel 18 and a cross-connect block 20. A coverplate 16 is disposed within chamber 13 and serves to hide and protect the wiring connections between protector unit 18 and connection unit 20. Door 28 may be closed and locked by a latch 90. Also, building entrance protector 10 is mounted to a building with the aid of mounting holes 94 through which screws or fasteners (not shown) may be inserted.

In a preferred embodiment, sidewall 74 and frictionally engaging edge 86 of door 28 are fabricated from a flexible material such as plastic. This helps to ensure repeatable use without damage to either sidewall 74 or door 28. This is most easily accomplished by fabricating entire housing unit 72 and door 28 from such a flexible material. Additionally, as shown in FIG. 2, frictionally engaging member 88 may be mounted on the center of outer side 76 of sidewall 74. Likewise, if used, a notch would correspondingly be placed at the center of the edge of door 28. This position allows for the greatest deflection of sidewall 74 which also helps to ensure repeatable use without damage to either sidewall 74 or door 28.

Figure 3:
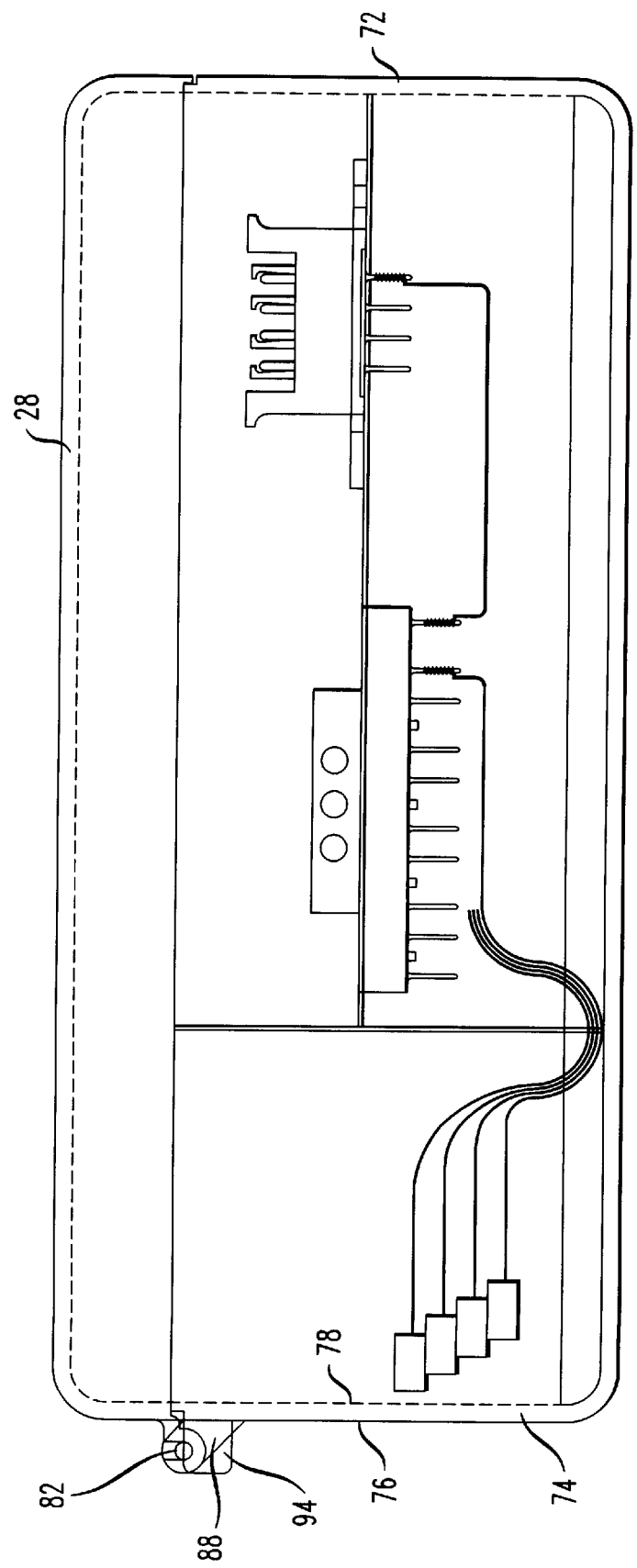
FIG. 3 illustrates a cross-sectional side view of the building entrance protector terminal illustrated in FIG. 1 with the door in a closed position.

Referring now to FIG. 3, building entrance protector 10 is shown with door 28 in a closed position. In a preferred embodiment, frictionally engaging member 88 is a boss which has a frictionally engaging portion 94. However it is possible that in other embodiments, for example, frictionally engaging member 88 may run the length of sidewall 74, or may be comprised of more that one boss. In the closed position, door 28 is seen to have rotated about axis of rotation 84 to its extreme clockwise position, allowing it to rest against housing unit 72.

Referring now to FIGS. 4 and 5, building entrance protector 10 is shown with door 28 in a partially opened position. In this position frictionally engaging edge 86 of door 28 interferes with frictionally engaging portion 94 of the frictionally engaging member 88. As seen in FIG. 5, this interference is a result of a smaller distance "x" from axis of rotation 84 to frictionally engaging edge 86 of door 28, as compared to the undeflected distance "y" from axis of rotation 84 to frictionally engaging portion 94 of frictionally engaging member 88 which interferes with frictionally engaging edge 86 of door 28. Additionally, in this position, as sidewall 74 is made of a flexible material, it deflects such that door 28 may pass through its full rotation.

Referring now to FIGS. 6 and 7, building entrance protector 10 is shown with door 28 in a secured opened position. In this position, frictionally engaging edge 86 of door 28 is fully engaged with frictionally engaging member 88. Frictionally engaging portion 94 of frictionally engaging member 88 in combination with frictionally engaging edge 86 of door 28 act to prevent door 28 from accidentally rotating in the clockwise direction. In this embodiment, frictionally engaging edge 86 of door 28 is shown to be beveled at such an angle that edge 86 sits flush against frictionally engaging member 88. Also in this embodiment, door 28 is shown to butt-up against sidewall 74. Sidewall 74 thus acts to prevent door 28 from further rotating in the counter-clockwise direction. Thus, in this embodiment, unwanted rotation in either the clockwise or counter-clockwise direction is jointly prevented by frictionally engaging member 88 in combination with frictionally engaging edge 86 of door 28, and sidewall 74.

Thus, the present invention is an arrangement to provide for the secure retention of door 28 of building entrance protector 10 when door 28 is in a fully opened position. This arrangement serves to restrain door 28 from unintentionally closing due to wind or other force.

While only certain features of the invention have been illustrated and described herein, many modifications, substitutions, changes or equivalents will now occur to those skilled in the art. It is therefore to be understood that the appended claims are intended to cover all such modifications and changes that fall within the true spirit of the invention.

What is claimed is:

1. A building entrance protector comprising:

a housing unit having a plurality of walls and a sidewall, said sidewall defining an outer side and an inner side;

a door coupled to said sidewall and rotatable about an axis of rotation, said door defining a frictionally engaging edge, said door positionable between a closed position and a secured opened position; and a frictionally engaging member mounted on said outer side of said sidewall so that when said door is rotated from said closed position to said secured opened position, said frictionally engaging edge interferes with said engaging member to restrain said door from rotating to said closed position.

2. The building entrance protector in accordance with claim 1, wherein the distance from said axis of rotation to said frictionally engaging edge of said door is less than the distance from the axis of rotation to a frictionally engaging portion of the frictionally engaging member.

3. The building entrance protector in accordance with claim 1, wherein said sidewall of said building entrance protector and said frictionally engaging edge are fabricated from a flexible material.

4. The building entrance protector in accordance with claim 3, wherein said building entrance protector and said door are fabricated from a flexible material.

5. The building entrance protector in accordance with claim 1, wherein said frictionally engaging member is a boss mounted on said side wall, said boss having a frictionally engaging portion.

6. The building entrance protector in accordance with claim 5, wherein said boss is mounted on the center of said side wall.

7. The building entrance protector in accordance with claim 1, wherein said frictionally engaging member is positioned on the center of said sidewall.

8. The building entrance protector in accordance with claim 1, further comprising a notch in said frictionally engaging edge of said door, wherein said frictionally engaging member mounted on said sidewall frictionally interferes with said notch to restrain said door.

9. The building entrance protector in accordance with claim 8, wherein said building entrance protector and said door are fabricated from a flexible material.

10. The building entrance protector in accordance with claim 8 wherein said notch is positioned on the center of said frictionally engaging edge and said frictionally engaging member is positioned on the center of said outer sidewall of said housing.

* * * * *